(12) United States Patent
Lee et al.

(10) Patent No.: US 12,083,551 B2
(45) Date of Patent: Sep. 10, 2024

(54) SUBSTRATE TREATING APPARATUS AND SUBSTRATE TREATING METHOD

(71) Applicant: SEMES CO., LTD., Cheonan-si (KR)

(72) Inventors: Sang Min Lee, Seoul (KR); Woo Jin Chung, Seongnam-si (KR); Ki Bong Kim, Paju-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 0 days.

(21) Appl. No.: 17/884,709

(22) Filed: Aug. 10, 2022

(65) Prior Publication Data
US 2023/0046276 A1    Feb. 16, 2023

(30) Foreign Application Priority Data

Aug. 12, 2021  (KR) .................. 10-2021-0106781

(51) Int. Cl.
| | |
|---|---|
| B05C 11/10 | (2006.01) |
| B05C 5/02 | (2006.01) |
| H01L 21/67 | (2006.01) |

(52) U.S. Cl.
CPC ........ B05C 5/0225 (2013.01); B05C 11/1002 (2013.01); B05C 11/1031 (2013.01)

(58) Field of Classification Search
USPC ................................................. 118/715, 684
See application file for complete search history.

(56) References Cited

U.S. PATENT DOCUMENTS

| | | | | |
|---|---|---|---|---|
| 4,227,547 A | * | 10/1980 | Cameron | F15B 20/001 137/554 |
| 6,911,092 B2 | * | 6/2005 | Sneh | H01L 21/67126 118/733 |
| 7,225,820 B2 | * | 6/2007 | Jones | H01L 21/67126 118/733 |
| 2005/0106893 A1 | * | 5/2005 | Wilk | H01L 29/513 438/785 |

(Continued)

FOREIGN PATENT DOCUMENTS

| | | |
|---|---|---|
| CN | 101176191 A | 5/2008 |
| JP | 2-87524 A | 3/1990 |

(Continued)

OTHER PUBLICATIONS

Japanese Office Action, dated Aug. 22, 2023, issued in corresponding Japanese Patent Application No. 2022-1261763.

(Continued)

*Primary Examiner* — Yewebdar T Tadesse
(74) *Attorney, Agent, or Firm* — Harness, Dickey & Pierce, P.L.C.

(57) ABSTRACT

The inventive concept provides a substrate treating apparatus. The substrate treating apparatus includes a chamber providing a treating space; and a fluid supply unit supplying a treating fluid to the chamber, and wherein the fluid supply unit includes: a supply tank storing the treating fluid; a supply line connecting the supply tank and the chamber; and a plurality of valves installed at the supply line, and wherein any one valve among the plurality of valves is provided as a safety valve, and wherein the safety valve is opened after confirming that the chamber has been switched to a closed state when supplying the treating fluid from a tank to the chamber.

9 Claims, 6 Drawing Sheets

(56) References Cited

U.S. PATENT DOCUMENTS

| | | | | |
|---|---|---|---|---|
| 2005/0173003 | A1* | 8/2005 | Laverdiere | G05D 16/2013 137/487.5 |
| 2006/0251815 | A1* | 11/2006 | Hamer | C23C 16/52 427/255.7 |
| 2018/0138060 | A1* | 5/2018 | Okamura | H01L 21/67126 |

FOREIGN PATENT DOCUMENTS

| | | |
|---|---|---|
| JP | 11-297659 A | 10/1999 |
| JP | 2002-511529 A | 4/2002 |
| JP | 2003-84801 A | 3/2003 |
| JP | 2007-234862 A | 9/2007 |
| JP | 2013-251547 A | 12/2013 |
| KR | 10-2013-0034590 A | 4/2013 |
| KR | 10-2013-0052991 A | 5/2013 |
| KR | 10-2013-0134996 A | 12/2013 |
| KR | 10-2015-0062906 A | 6/2015 |
| KR | 10-2016-0135035 A | 11/2016 |
| KR | 10-2020-0038390 A | 4/2020 |
| TW | 201402203 A | 1/2014 |
| WO | WO-2016-121075 A1 | 8/2016 |

OTHER PUBLICATIONS

Office Action for Korean Application No. 10-2021-0106781 dated Mar. 24, 2023.
Office Action for Taiwanese Application No. 11220227340 dated Mar. 8, 2023.

* cited by examiner

SUBSTRATE TREATING APPARATUS AND SUBSTRATE TREATING METHOD

CROSS-REFERENCE TO RELATED APPLICATIONS

A claim for priority under 35 U.S.C. § 119 is made to Korean Patent Application No. 10-2021-0106781 filed on Aug. 12, 2021, in the Korean Intellectual Property Office, the entire contents of which are hereby incorporated by reference.

BACKGROUND

Embodiments of the inventive concept described herein relate to a substrate treating apparatus and a substrate treating method.

In order to manufacture a semiconductor element, a desired pattern is formed on a substrate through various processes such as a photolithography process, an etching process, an ashing process, an ion implantation process, and a thin film deposition process. Various treating liquids are used in each process, and contaminants and particles are generated during the process. In order to remove these, a cleaning process for cleaning the contaminants and the particles is essentially performed before and after each process.

In general, in the cleaning process, the substrate is treated with a chemical and a rinsing liquid and then dried. A drying treatment step is a process for drying the rinsing liquid remaining on the substrate, and the rinsing liquid on the substrate is replaced with an organic solvent having a lower surface tension than the rinsing liquid such as an isopropyl alcohol (IPA), and then the organic solvent is removed. However, as a distance (CD) between patterns formed on the substrate becomes finer, it is not easy to remove the organic solvent remaining in a space between the patterns.

Recently, a process of removing the organic solvent remaining on the substrate using a supercritical fluid is performed. In a supercritical treatment process, a high-pressure apparatus is used to satisfy certain conditions of the supercritical fluid. The high-pressure apparatus includes a tank storing a high-pressure fluid, and a high-pressure pipe providing a path for transferring a stored high-pressure fluid of the tank to a process chamber. A plurality of valves are installed at a high-pressure pipe, and the plurality of valves installed at the high-pressure pipe are controlled by one controller. However, when the plurality of valves are controlled by one controller, a dangerous situation may occur in which the high-pressure fluid is supplied even when the process chamber is not closed. In addition, in abnormal situations such as controller errors or a disconnection of a power supply to the apparatus, a valve may not be controlled, resulting in the high-pressure fluid flowing out of a high-pressure tank to the process chamber, or a pressure inside the high-pressure tank rising to a design pressure or above, causing a tank to burst.

SUMMARY

Embodiments of the inventive concept provide a substrate treating apparatus and method capable of ensuring a safety of a chamber in which a substrate treatment is carried out in a high pressure atmosphere.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a chamber providing a treating space; and a fluid supply unit supplying a treating fluid to the chamber, and wherein the fluid supply unit includes: a supply tank storing the treating fluid; a supply line connecting the supply tank and the chamber; and a plurality of valves installed at the supply line, and wherein any one valve among the plurality of valves is provided as a safety valve, and wherein the safety valve is opened after confirming that the chamber has been switched to a closed state when supplying the treating fluid from a tank to the chamber.

In an embodiment, the safety valve is provided closest to the supply tank among the plurality of valves.

In an embodiment, the safety valve and a remaining valve except for the safety valve among the plurality of valves are controlled by different control modules.

In an embodiment, the safety valve is controlled by a first control module, and the remaining valve is controlled by a second control module, and wherein the first control module includes: a first controller controlling an open/close of the safety valve; and a safety controller controlling an operation of the first controller, and wherein the safety controller controls a power supplied to the first controller to control the first controller.

In an embodiment, the first control module further comprises a relay operated by receiving a power supply signal of the safety controller and transmitting a power supplied by the safety controller to the first controller.

In an embodiment, the fluid supply unit further comprises an integrated controller controlling the plurality of valves, and wherein the first controller receives an open signal of the integrated controller and an open signal of the safety controller to control the safety valve to open the safety valve.

In an embodiment, the safety valve includes a solenoid valve.

In an embodiment, the safety valve includes a normal close valve (N/C valve)

In an embodiment, the supply tank is a high pressure tank, and the chamber is a high pressure chamber.

The inventive concept provides a substrate treating apparatus. The substrate treating apparatus includes a chamber providing a treating space; a fluid supply unit supplying a treating fluid to the chamber, and wherein the fluid supply unit includes: a supply tank storing the treating fluid; a supply line connecting the supply tank and the chamber; and a plurality of valves installed at the supply line; and a control module controlling the plurality of valves, and wherein a safety valve provided closest to a tank among the plurality of valves is controlled by another valve and another control module.

In an embodiment, the safety valve is controlled to supply the treating fluid after confirming that the chamber has been switched to a closed state when supplying the treating fluid from the tank to the chamber.

In an embodiment, the safety valve is controlled by a first control module, a remaining valve except for the safety valve among the plurality of valves is controlled by a second control module, and wherein the first control module includes: a first controller controlling an open/close of the safety valve; a safety controller controlling an operation of the first controller; and a relay operated by receiving a signal of the safety controller and transmitting a power supplied by the safety controller to the first controller, and wherein the safety controller controls a power supplied to the first controller to control the first controller.

In an embodiment, the safety valve is a normal close valve (N/C valve).

The inventive concept provides a substrate treating method. The substrate treating method includes supplying a treating fluid to a treating space of a chamber for treating a substrate to treat the substrate, and wherein a supply of the treating fluid is performed by controlling a plurality of valves installed on a supply line connecting a tank for storing the treating fluid and the chamber, and wherein a valve closest to the tank among the plurality of valves is provided as a safety valve, and the safety valve is opened after confirming that the chamber has been switched to a closed state.

In an embodiment, the safety valve is controlled by a first controller, and a remaining valve except for the safety valve among the plurality of valves is controlled by a second controller.

In an embodiment, the first controller is controlled by the safety controller, and the safety controller controls a power supplied by the first controller.

In an embodiment, the safety valve is opened when an open signal of the integrated controller and an open signal of the first controller for controlling the plurality of valves are both received.

In an embodiment, the safety valve is a solenoid valve.

In an embodiment, the safety valve is a normal close valve (N/C valve).

In an embodiment, the chamber is provided as a high pressure chamber.

According to an embodiment of the inventive concept, a substrate treating apparatus and method capable of ensuring a safety of a chamber in which a substrate treatment is performed in a high pressure atmosphere may be provided.

According to an embodiment of the inventive concept, a stability of an apparatus may be improved by supplying a treating fluid after confirming that a chamber has been switched to a closed state when the treating fluid is supplied from a tank at which a high pressure treating fluid is stored to the chamber.

According to an embodiment of the inventive concept, a stability of an apparatus may be improved by configuring a controller alone for controlling a valve provided at a position closest to a tank.

According to an embodiment of the inventive concept, a stability of an apparatus may be improved by controlling a controller for controlling a valve provided at a position closest to a tank using a power supply as a control means.

According to an embodiment of the inventive concept, a stability of an apparatus may be improved because a pressure of a tank does not leak even in a power supply cut-off state.

According to an embodiment of the inventive concept, a stability of an apparatus may be improved by configuring a controller alone for controlling a valve provided at a position closest to a tank.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
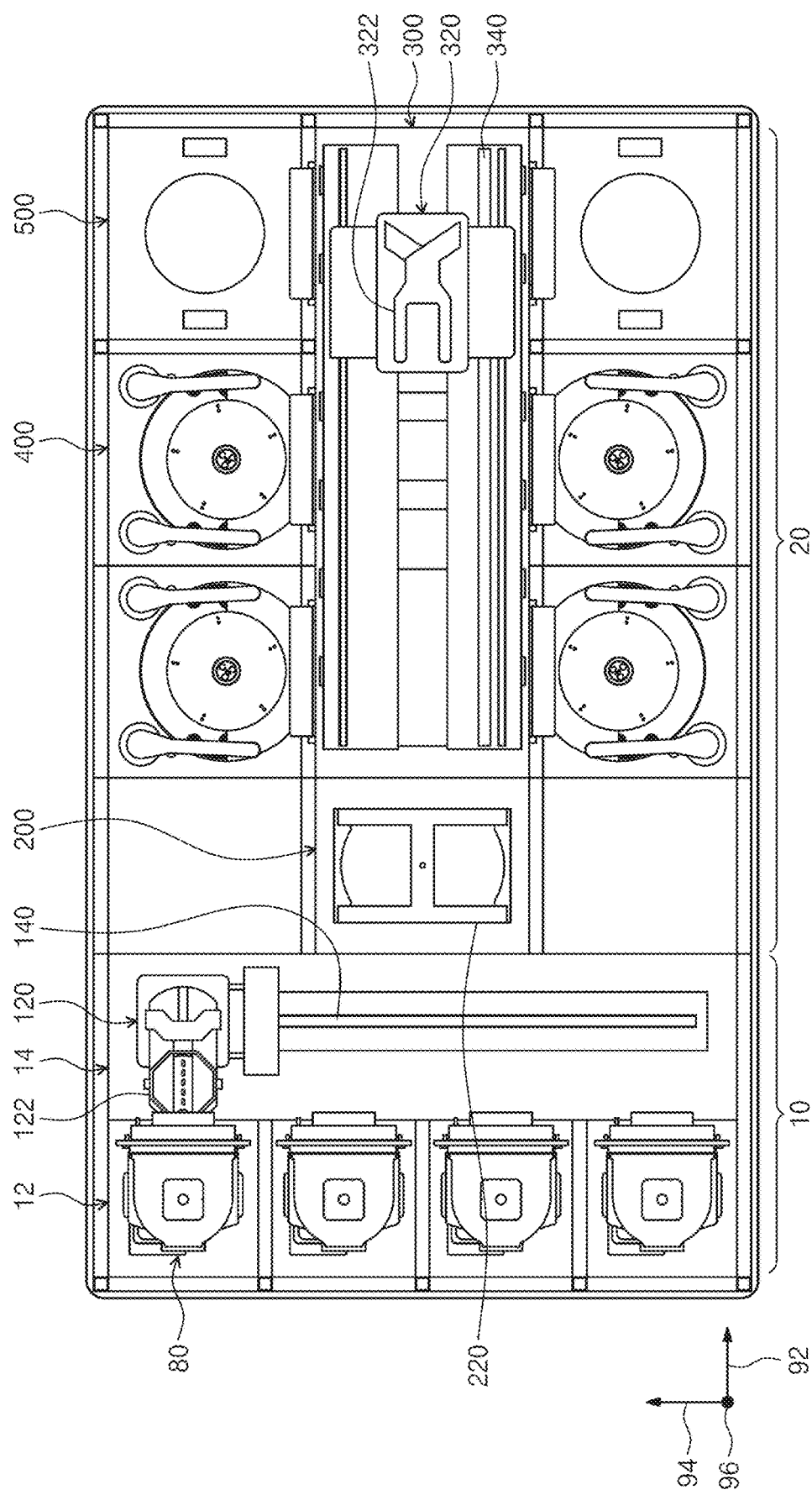
FIG. 1 is a plan view of a substrate treating apparatus according to an embodiment of the inventive concept.

Hereinafter, embodiments of this invention will be described in detail with reference to the accompanying drawings so that those of ordinary skill in the technical field to which this invention belongs can easily implement this invention. However, the inventive concept may be implemented in various different forms and is not limited to the embodiments described herein. In addition, in describing a correct embodiment of the inventive concept in detail, when it is determined that a detailed description of related known functions or configurations may unnecessarily obscure the gist of the inventive concept, the detailed description thereof will be omitted. In addition, a same sign is used throughout the drawing for parts with similar functions and actions.

To "include" a component means that it may include more other components, not excluding other components unless otherwise stated. Specifically, the term "include" or "have" should be understood to designate that there are features, numbers, steps, operations, components, or a combination thereof described in the specification, and do not preclude the presence or addition of one or more other features or numbers, steps, operations, components, or combinations thereof.

The singular expression includes plural expressions unless the context clearly implies otherwise. In addition, shapes and sizes of elements in the drawings may be exaggerated for clearer explanation.

The term "and/or" includes any one of the listed items and all combinations of one or more. In addition, in the present specification, the term "connected" means not only a case where member A and member B are directly connected, but also a case where member C is interposed between member A and member B to indirectly connect member A and member B.

Embodiments of the inventive concept may be modified in various forms, and the scope of the inventive concept should not be construed as being limited to the following embodiments. The embodiment of the inventive concept is provided to more fully explain the inventive concept on to those with average knowledge in the art. Therefore, the shape of the elements in the drawing has been exaggerated to emphasize a clearer explanation.

The apparatus of the inventive concept may be used to perform a photolithography process on a circular substrate. In particular, an apparatus of the inventive concept may be connected to an exposing apparatus to perform a coating process and a developing process on a substrate. However, the technical idea of the inventive concept is not limited thereto, and may be used in various kinds of processes of supplying a treating liquid to the substrate while rotating the substrate. Hereinafter, a case in which a wafer is used as a substrate will be described as an example.

Hereinafter, embodiments of the inventive concept will be described in detail with reference to FIG. 1 to FIG. 6.

FIG. 1 illustrates a substrate treating apparatus according to an embodiment of the inventive concept. Referring to FIG. 1, the substrate treating apparatus comprises an index module 10, a treating module 20, and a controller (not shown). According to an embodiment, the index module 10 and the treating module 20 are arranged in a row. Hereinafter, a direction in which the index module 10 and the treating module 20 are arranged will be referred to as a first direction 92. A direction that is perpendicular to the first direction 92 when viewed from above will be referred to as a second direction, and a direction that is perpendicular to both the first direction 92 and the second direction 94 will be referred to as a third direction 96.

The index module 10 returns the substrate W from the container 80 where the substrate W is stored to the treating module 20, and gets the treated substrate W from the treating module 20 to be stored in the container 80. The index module 10 is provided with its length extending along the second direction 94. The index module 10 has a loadport 12 and an index frame 14. The index frame 14 is placed between the loadport 12 and the treating module 20. The container 80 in which the substrates W are stored is placed on the loadport 12. A plurality of load ports 12 may be provided, and the plurality of load ports 12 may be placed along the second direction 94.

For the container 80, a closing-type container such as the Front Open Unified Pod (FOUP) can be used. The container 80 can be placed on the loadport 12 by an overhead transfer, an overhead conveyor, an automatic guided vehicle, or by an operator.

The index frame 14 is provided with an index robot 120. In the index frame 14, a guide rail 140 provided with its length extending along the second direction 94, and the index robot 120 may be provided movable on the guide rail 140. The index robot 120 includes a hand 122 on which the substrate W is placed, and the hand 122 can be provided forwardly and backwardly movable, rotatable with the third direction 96 as an axis, and movable along the third direction 96. A plurality of hands 122 are provided vertically placed apart, and the hands 122 can be forwardly and backwardly movable independent of each other.

The treating module 20 includes a buffer unit 200, a transfer device 300, a liquid treatment device 400, and a supercritical device 500. The buffer unit 200 provides a temporary space for the substrate W being brought into the treating module 20 and the substrate W being taken from the treating module 20. The liquid treatment device 400 supplies liquid to the substrate W to perform a liquid treatment process on the substrate W. The supercritical device 500 performs a drying process to remove the liquid remaining on the substrate W. The transfer device 300 transfers the substrate W between the buffer unit 200, the liquid treatment device 400, and the supercritical device 500.

The transfer device 300 may be provided with its length extending along the first direction 92. The buffer unit 200 can be placed between the index module 10 and the transfer device 300. The liquid treatment device 400 and supercritical device 500 may be placed on the side of the transfer unit 300. The liquid treatment device 400 and the transfer device 300 may be arranged in the second direction 94. The supercritical device 500 and the transfer device 300 may be arranged in the second direction 94. The buffer unit 200 may be provided at an end of the transfer device 300.

In an embodiment, the liquid treatment devices 400 may be placed on both sides of the transfer device 300, the supercritical units 500 may be placed on both sides of the transfer device 300, and the liquid treatment devices 400 may be placed closer to the buffer unit 200 than the supercritical units 500. On one side of the transfer device 300, liquid treatment devices 400 may be provided in an array of A×B (A, B are natural numbers greater than 1 or 1 respectively) along the first direction 92 and third direction 96 respectively. In addition, on one side of the transfer device 300, supercritical units 500 may be provided in an array of C×D (C, D are natural numbers greater than 1 or 1 respectively) along the first direction 92 and the third direction 96 respectively. Unlike the aforementioned, only liquid treatment devices 400 may be provided on one side of the transfer device 300 and only supercritical units 500 may be provided on the other side.

The transfer device 300 has a transfer robot 320. Within the transfer device 300, a guide rail 340 is provided with its length extending along the first direction 92 and the transfer robot 320 may be provided movable on the guide rail 340. The transfer robot 320 includes a hand 322 on which the substrate W is placed, and the hand 322 may be provided forwardly and backwardly movable, rotatable with the third direction 96 as an axis, and movable along the third direction 96. A plurality of hands 122 are provided vertically placed apart, and the hands 122 can be forwardly and backwardly movable independent of each other.

The buffer unit 200 has a plurality of buffers 220 on which the substrates W are placed. The buffers 220 may be provided placed apart from each other along the third direction 96. The buffer unit 200 has an open front side and an open rear side. The front side faces the index module 10, and the rear side faces the transfer device 300. The index robot 120 can access the buffer unit 200 through the front side and the transfer robot 320 can access the buffer unit 200 through the rear side.

Figure 2:
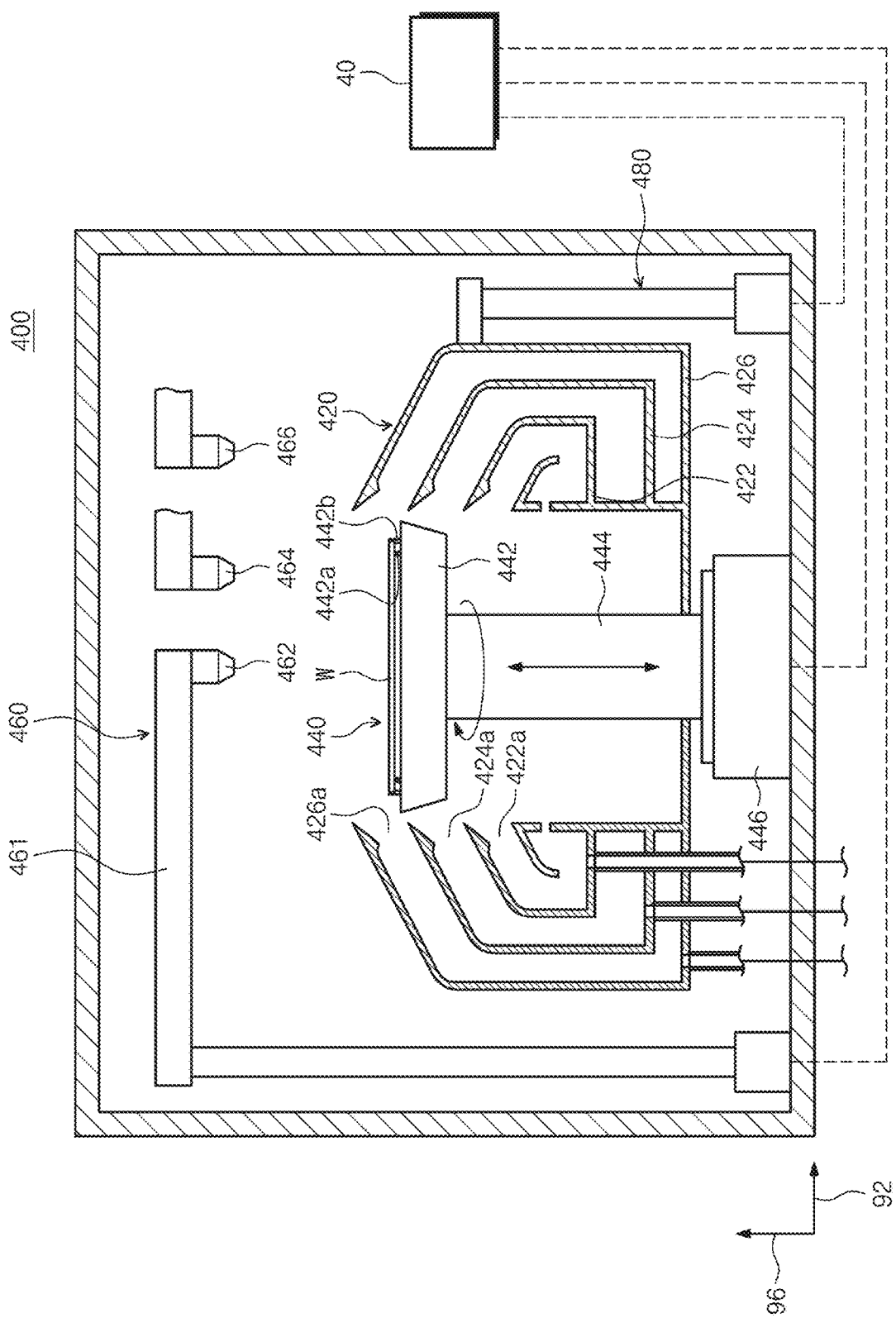
FIG. 2 is a cross-sectional view of a liquid treatment chamber of FIG. 1.

FIG. 2 is a sectional view of the liquid treatment chamber in FIG. 1. Referring to FIG. 2, the liquid treatment device 400 has a housing 410, a cup 420, a support unit 440, a liquid supply unit 460, a lifting/lowering unit 480, and a controller 40. The controller 40 controls the operation of the liquid supply unit 460, the support unit 440, and the lifting/lowering unit 480. The housing 410 is generally provided in a rectangular parallelepiped shape. The cup 420, the support unit 440, and the liquid supply unit 460 are located in the housing 410.

The cup 420 has a treating space with an open top portion, and the substrate W is liquid treated within the treating space. The support unit 440 supports the substrate W within the treating space. The liquid supply unit 460 supplies the liquid onto the substrate W supported by the support unit 440. Liquid can be provided in multiple types, and supplied sequentially onto the substrate W. The lifting/lowering unit 480 adjusts the relative height between the cup 420 and the support unit 440.

In an embodiment, the cup 420 has a plurality of collecting bowls 422, 424, and 426. Each of the collecting bowls 422, 424, and 426 have a collecting space to collect the liquid used to process the substrate. Each collecting bowl 422, 424, and 426 is provided in a ring shape surrounding the support unit 440. When the liquid treatment process is carried out, the treating liquid scattered by rotation of the substrate W flows into the collecting space through the inlets 422a, 424a, and 426a of each collecting bowl 422, 424, and 426. In an embodiment, the cup 420 has a first collecting bowl 422, a second collecting bowl 424, and a third collecting bowl 426. The first collecting bowl 422 is placed to surround the support unit 440, the second collecting bowl 424 is placed to surround the first collecting bowl 422, and the third collecting bowl 426 is placed to surround the second collecting bowl 424. The second inlet 424a that flows liquid into the second collecting bowl 424 may be located above the first inlet 422a that flows liquid into the first collecting bowl 422, and the third inlet 426a that flows liquid into the third collecting bowl 426 may be located above the second inlet 424a.

The support unit 440 has a support plate 442 and a drive shaft 444. The top surface of the support plate 442 is generally provided in a circular shape and may have a diameter greater than the substrate W. At the center of the support plate 442, a support pin 442a is provided to support the bottom surface of the substrate W, and an top end of the support pin 442a is provided to protrude from the support plate 442 so that the substrate W is placed apart from the support plate 442. A chuck pin 442b is provided at the edge of the support plate 442.

The chuck pin 442b is provided to protrude upwards from the support plate 442, supporting the side of the substrate W so that when the substrate W is rotated, the substrate W does not deviate from the support unit 440. The drive shaft 444 is driven by a driving member 446 and is connected to the center of the bottom surface of the substrate W and rotates the support plate 442 relative to its center axis.

In an embodiment, the liquid supply unit 460 has a first nozzle 462, a second nozzle 464, and a third nozzle 466. The first nozzle 462 supplies a first liquid onto the substrate W. The first liquid may be the liquid that removes a layer or foreign substances remaining on the substrate W. The second nozzle 464 supplies a second liquid onto the substrate W. The second liquid may dissolve well in a third liquid. For example, the second liquid may dissolve better in the third liquid than in the first liquid. The second liquid may neutralize the first liquid supplied on the substrate W. In addition, the second liquid may neutralize the first liquid and at the same time dissolve better in the third liquid compared to the first liquid.

In an embodiment, the second liquid can be water. The third nozzle 466 supplies the third liquid onto the substrate W. The third liquid may dissolve well in the supercritical liquid used in the supercritical device 500. For example, the third liquid may dissolve better in the supercritical liquid used in the supercritical device 500 compared to the second liquid. In an embodiment, the third liquid can be an organic solvent. The organic solvent may be isopropyl alcohol (IPA). In an embodiment, the supercritical liquid can be carbon dioxide.

The first nozzle 462, the second nozzle 464, and the third nozzle 466 are supported by a different arm 461 and these arms 461 can be moved independently. Optionally, the first nozzle 462, the second nozzle 464, and the third nozzle 466 may be installed on the same arm and move simultaneously.

The lifting/lowering unit 480 moves the cup 420 vertically. The relative height between the cup 420 and the substrate W is changed by the vertical movement of the cup 420. As a result, the collecting bowl 422, 424, and 426 that collects the treating liquid changes depending on the type of liquid supplied to the substrate W, so the liquids can be separately collected. Unlike the aforementioned, the cup 420 is fixedly installed and the lifting/lowering unit 480 can vertically move the support unit 440.

The controller 1800 may control the entire operation of the substrate treating apparatus 10. The controller 1800 may control each component of the substrate treating apparatus 10. The controller 1800 may include a central processing unit (CPU), a read only memory (ROM), and a random access memory (RAM). The CPU executes a desired processing such as an etching treatment according to various recipes stored in a storage area thereof. The recipe contains a process time, a process pressure, a process temperature, and various gas flow rates, which are control information of the device for process conditions. Meanwhile, recipes representing these programs or treatment conditions may be stored in a hard disk or a semiconductor memory. In addition, the recipe may be set at a preset position in the storage area while being accommodated in a storage medium readable by a portable computer such as a CD-ROM or a DVD.

Figure 3:
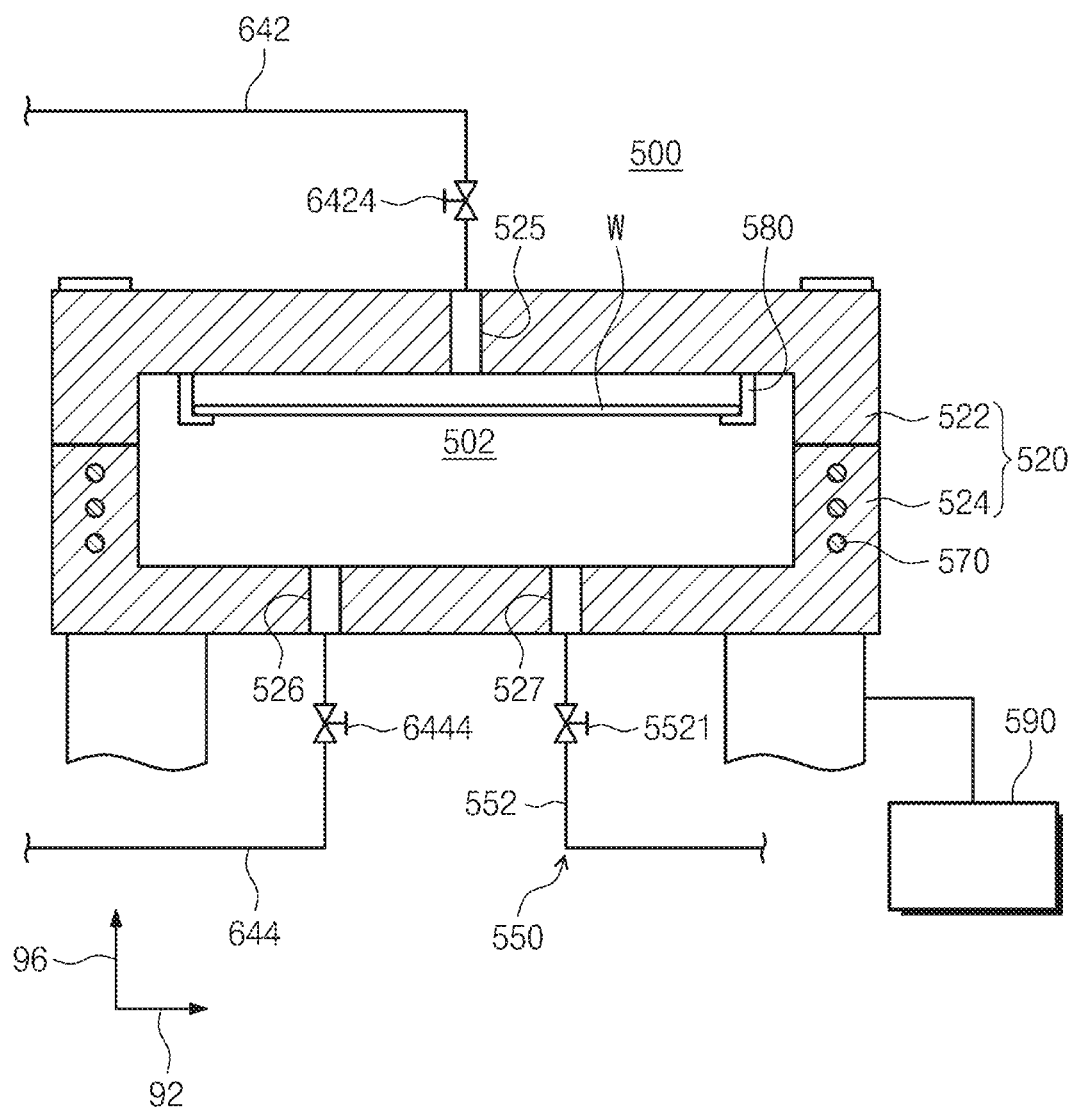
FIG. 3 is a cross-sectional view of the drying treatment chamber of FIG. 1.
Figure 4:
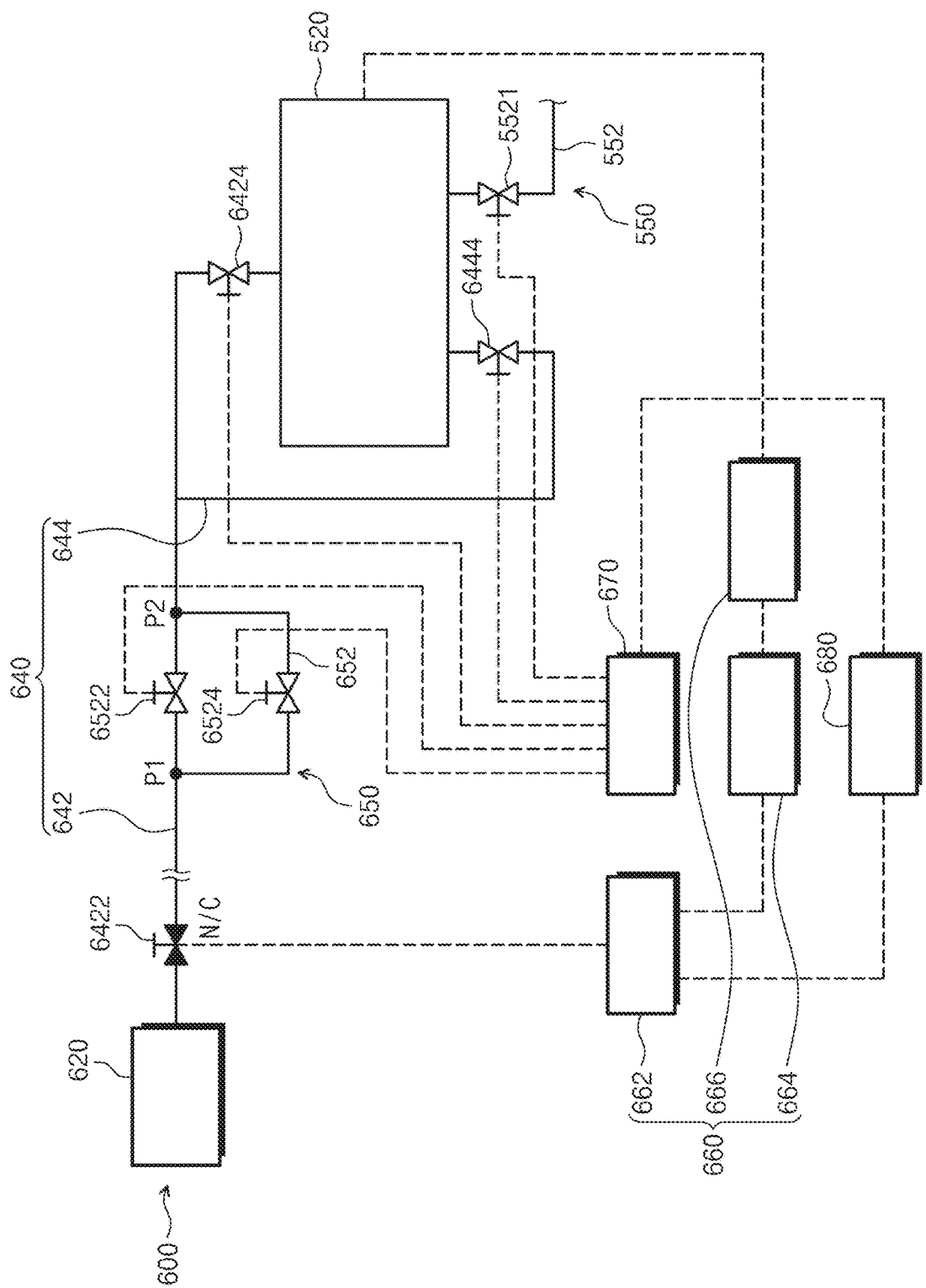
FIG. 4 illustrates a drying treatment apparatus according to an embodiment of the inventive concept.

FIG. 3 is a sectional view of a drying treatment chamber of FIG. 1. FIG. 4 is a dry treating device according to an embodiment of the inventive concept. According to an embodiment, the dry treating device 500 removes a liquid from the substrate W using a supercritical liquid. According to one embodiment, the liquid on the substrate W is an isopropyl alcohol (IPA). The dry treating device 500 supplies the supercritical liquid onto the substrate and dissolves the IPA on the substrate W in the supercritical liquid to remove the IPA from the substrate W.

Referring to FIG. 4, the dry treating device 500 includes a process chamber 520, a liquid supply line 540, the support unit 580, a driving member 590, and an exhaust unit 550.

Referring to FIG. 3, the process chamber 520 provides a treating space 502 in which the supercritical process is performed. In an embodiment, a process chamber 520 may be provided in a cylindrical shape. Alternatively, it may be provided in a rectangular parallelepiped shape. The process chamber 520 has a first body 522 and a second body 524. The first body 522 and the second body 524 combine to provide the treating space 502. In an embodiment, the first body 522 is provided in a circular shape when viewed from the top. Similarly, the second body 524 is provided in a circular shape when viewed from the top. In an embodiment, the first body 522 is provided above the second body 524. In this case, the first body 522 and the second body 524 may open and close vertically. Optionally, the first body 522 and the second body 524 may be provided at the same height. In this case, the first body 522 and the second body 524 may open and close horizontally.

After the first body 522 and the second body 524 are decoupled to expose the treating space 502, the substrate W is brought in or out. The driving member 590 ascends or descends either the first body 522 or the second body 524 so that the process chamber 520 is changed to the opening state or the closing state. During a process, the first body 522 and the second body 524 closely contact each other so the treating space 502 is closed from the outside.

In an embodiment, the driving member 590 may be provided as a cylinder (not shown) for lifting/lowering the first body 502 or the second body 524. For example, the driving member 590 lifts and lowers the second body 524. The opening state is the state when the first body 522 and second body 524 are decoupled to be placed apart from each other, and the closing state is the state when the contact surfaces of the first body 522 and second body 524 contact each other to couple together. In other words, in the opening state, the treating space 502 is opened to the outside, and in the closing state, the treating space 502 is closed.

In an embodiment, in the first body 522 a first discharge hole 525 may be formed to which a first supply line 642 is connected. Liquid can be supplied to the treating space 502 through the first discharge hole 525. In the example, in the second body 524 a second discharge hole 526 to which a second supply line 562 is connected and an exhaust hole 527 to which an exhaust line 552 is connected may be formed. Optionally, the process chamber 520 may only be provided with either the first discharge hole 525 or the second discharge hole 526. In an embodiment, a heater 570 is provided inside the wall of the process chamber 520. The heater 570 heats the treating space 502 of the process chamber 520 so that the liquid supplied into the inner space of the process chamber 520 remains supercritical. Inside the treating space 502 an atmosphere is formed by the supercritical liquid.

The support unit 580 supports the substrate W within the treating space 502 of the process chamber 520. The substrate W brought into the treating space 502 of the process chamber 520 is placed on the support unit 580. For example, the substrate W is supported by the support unit 580 with the pattern surface facing upwards. In an embodiment, the support unit 580 supports the substrate W above the second discharge hole 526. In an embodiment, the support unit 580 may be coupled to the first body 522. Optionally, the support unit 580 may be coupled to the second body 524.

Also, the exhaust unit 550 couples to the second body 524. The supercritical liquid in the treating space 502 of the process chamber 520 is exhausted to the outside of the process chamber 520 through the exhaust unit 550. The exhaust unit 550 includes an exhaust line 552 and an exhaust valve 5521. The exhaust valve 5521 is installed in the exhaust line 552 to adjust the exhaust and exhaust rate of the treating space 502.

Referring back to FIG. 4, a fluid supply unit 600 includes a supply tank 620, a supply line 640, and a control module. The fluid supply unit 600 supplies a treating fluid to a treating space 502 of the chamber 520.

The treating fluid to be supplied to the chamber 520 is stored in the supply tank 620. The treating fluid may be a fluid in a supercritical state. For example, the treating fluid may be a carbon dioxide in a state of a pressure of 100 to 200 bar and a temperature of 50° C. to 90° C. The treating fluid stored in the supply tank 620 is supplied to the treating space 502 of the chamber 520 through the supply line 640.

The supply line 640 connects the supply tank 620 and the chamber 520. The supply line 640 includes a first supply line 642 and a second supply line 644. The first supply line 642 connects the supply tank 620 to a first body 522 of the chamber 520. An end of the first supply line 642 is connected to the supply tank 620 and the other end thereof is connected to a first discharge hole 525 of the first body 522. Accordingly, a treating fluid flowing through the first supply line 642 is supplied to the treating space 502 through the first discharge hole 525. The second supply line 644 branches from the first supply line 644. An end of the second supply line 644 is connected to the first supply line 644, and the other end thereof is connected to a second discharge hole 526 of a second body 524 of the chamber 520. Accordingly, a treating fluid flowing through the second supply line 644 is supplied to the treating space 502 through the second discharge hole 526. The treating fluid may be supplied to the treating space 502 through each of the first discharge hole 525 and the second discharge hole 526.

The fluid supply unit 600 may include a flow rate adjustment unit 650 provided on the supply line 640. The flow rate adjustment unit 650 may adjust a flow rate of the treating fluid supplied to the chamber 520. The flow rate adjustment unit 650 is provided on the first supply line 642. The flow rate adjustment unit 650 includes a branch line 652 and a plurality of valves. The branch line 652 branches at a first point P1 on the first supply line 642 and joins at a second point P2 on the first supply line 642. The plurality of valves may include a first valve 6522 and a second valve 6524. The first valve 6522 is installed on the first supply line 642 and is provided between the first point P1 and the second point P2. The second valve 6524 is provided at the branch line 6524. The first valve 6522 and the second valve 6524 are provided as flow rate adjustment valves. An opening degree of each of the first valve 6522 and the second valve 6524 may be different from each other. In an embodiment, the opening degree of the first valve 6522 may be set to be greater than the opening degree of the second valve 6524. In an embodiment, when the first valve 6522 is opened and the second valve 6524 is closed, a flow rate of the treating fluid supplied to the treating space 502 may be referred to as a first flow rate, and when the first valve 6522 is closed and the second valve 6524 is opened, the flow rate of the treating fluid supplied to the treating space 502 may be referred to as a second flow rate. In this case, the first flow rate may be greater than the second flow rate. When a supply amount of the treating fluid supplied to the chamber 520 needs to be increased, only the first valve 6522 may be opened, or all of the first and second valves 6522 and 6524 may be opened to supply to the chamber 520. In addition, when the supply amount of the treating fluid supplied to the chamber 520 needs to be reduced, only the first valve 6522 or the second valve 6524 may be opened. In addition, when the treating fluid having the first flow rate needs to be supplied to the chamber 520, the first valve 6522 may be opened and the second valve 6524 may be closed. In addition, when the treating fluid of the second flow rate needs to be supplied to the chamber 520, the first valve 6522 may be closed and the second valve 6524 may be opened.

In the above description, since one branch line 6524 which is the flow rate adjustment unit 650 is included, the flow rate of the treating fluid is illustrated to be adjusted by the first valve 6522 and the second valve 6524, but the inventive concept is not limited thereto. In an embodiment, the branch line 6524 may be provided as a plurality of branch lines, and a flow rate adjustment valve may be provided at each of the plurality of branch lines. In addition, although it has been described above that a flow rate adjustment valve is installed at a pipe of the flow rate adjustment unit 650, the inventive concept is not limited thereto. In an embodiment, both an opening/closing valve and the flow adjustment valve may be installed between the first point P1 and the second point P2, and both the opening/closing valve and the flow adjustment valve may be installed at the branch line 6524. In this case, a flow path of the treating fluid may be set by an on/off of the opening/closing valve.

A first supply valve 6424 is installed on the first supply line 642. The first supply valve 6424 is provided at a position adjacent to the first discharge hole 525 of the first body 522. The first supply valve 6424 adjusts a supply of the treating fluid to the treating space 502 through the first discharge hole 525. That is, when the first supply valve 6425 is opened, the treating fluid is supplied through the first discharge hole 525, and when the first supply valve 6424 is closed, the treating fluid is not supplied to the treating space 502.

A second supply valve 6444 is installed on the second supply line 644. The second supply valve 6444 is provided at a position adjacent to the second discharge hole 526 of the second body 524. The second supply valve 6444 adjusts the supply of the treating fluid to the treating space 502 through the second discharge hole 526. That is, when the second supply valve 6444 is opened, the treating fluid is supplied through the second discharge hole 526, and when the second supply valve 6444 is closed, the treating fluid is not supplied to the treating space 502.

A plurality of valves may be installed on the supply line 640. In an embodiment, the plurality of valves may include the first valve 6522, the second valve 6524, the first supply valve 6424, the second supply valve 6444 and the safety valve 6422 described above. The safety valve 6422 may be provided as a solenoid valve. The safety valve 6422 may be provided as an N/C valve (normal close valve). The safety valve 6422 is normally maintained in a closed state and is opened only when it is controlled to be opened by the first controller 662. Accordingly, it is possible to prevent a high-pressure treating fluid from flowing out of the tank 620 in an abnormal situation such as an error of the control module or a power supply cutoff.

The safety valve 6422 is provided at a position closest to the tank 620 among the plurality of valves. The safety valve 6422 can be controlled to be opened after confirming that the chamber 520 has been switched to a closed state when supplying the treating fluid from the tank 620 to the chamber 520. The safety valve 6422 and remaining valves except for the safety valve 6422 among the plurality of valves are controlled by different control modules. In an embodiment, the safety valve 6422 is controlled by the first control module 660 and the remaining valves except for the safety valve 6422 are controlled by the second control module 670.

The first control module 660 is provided as a hardware interlock. The first control module 660 may mechanically and electrically configure the safety valve 6422 for supplying a high pressure treating fluid to improve a stability. The first control module 660 includes a first controller 662 for controlling whether the safety valve 6422 is opened or closed, a safety controller 666 for controlling whether the first controller 662 is operated, and a relay 664, which is operated by receiving a power supply signal from the safety controller 666 and which transmits a power supplied from the safety controller 666 to the first controller 662.

An open/close of the safety valve 6422 determined by the first controller 662. The first controller 662 is controlled by the safety controller 666. The safety controller 666 controls a power supplied to the first controller 662 to control the first controller 662. The safety controller 666 receives a signal from a sensor installed in the chamber 520. The safety controller 666 checks whether the chamber 520 is switched to a closed state by a sensor installed at the chamber 520. When it is confirmed whether or not the chamber 520 is closed, the safety controller 666 supplies the power to the first controller 662. When the power is supplied to the first controller 662, the first controller 662 controls the safety valve 6422 so that the safety valve 6422 is opened. When the safety valve 6422 is opened, the treating fluid inside the tank 620 may be supplied into the supply line 640. In an embodiment, the safety valve 6422 is provided as an air valve, and the first controller 662 supplies an air to the safety valve 6422 when the power is supplied from the safety controller 666. The safety valve 6422 supplied with the air is opened. When the closed state of the chamber 520 is not confirmed, the safety controller 666 does not supply power to the first controller 662. In this case, the safety valve 6422 is maintained in the closed state. In an embodiment, when the safety controller 666 does not supply the power to the first controller 662, since the first controller 662 does not supply the air to the safety valve 6422, the safety valve 6422 is maintained in the closed state.

The relay 664 may be provided between the first controller 662 and the safety controller 666. The relay 664 may be an electronic component that is turned on or off through an electrical signal. The relay 664 receives the power from the safety controller 666, and when the power is supplied, it is turned on to supply the power to the first controller 662. When the power is not supplied from the safety controller 666, the relay 664 is turned off and cannot supply the power to the first controller 662. The relay 664 may serve as a power switch between the first controller 662 and the safety controller 666.

The second control module 670 includes a second controller 670. The second controller 670 controls the remaining valves except for the safety valve 6422 among the plurality of valves. In an embodiment, the second controller 670 controls whether the first valve 6522, the second valve 6524, the first supply valve 6424, and the second supply valve 6444 are opened and closed.

The fluid supply unit 600 includes an integrated controller 680. The integrated controller 680 controls the fluid supply unit 600. In an embodiment, the integrated controller 680 controls a plurality of valves including the safety valve 6422. The integrated controller 680 controls the plurality of valves to be selectively opened according to the supply amount of the treating fluid to be supplied from the chamber 520 and the supply path. The integrated controller 680 controls the valves on the supply line 640 to be closed when the treating fluid inside the chamber 620 needs to be exhausted, and controls the exhaust valve 5521 on the exhaust line 552 to be opened.

The first controller 662 receives an open signal of the safety valve 6422 from the integrated controller 680, and receives the power from the safety controller 666. Even if the first controller 662 receives the open signal from the integrated controller 680, the first controller 662 does not adjust the safety valve 6422 to be opened when the power is not supplied from the safety controller 666. The first controller 662 controls the safety valve 6422 to be opened only when both the open signal of the integrated controller 680 and the power of the safety controller 666 are supplied. Accordingly, even though the integrated controller 680 transmits an open signal of the safety valve 6422 in a state in which the chamber 520 is not completely closed, the safety valve 6422 is maintained in the closed state, and thus the treating fluid is not supplied from the tank 620.

Figure 5:
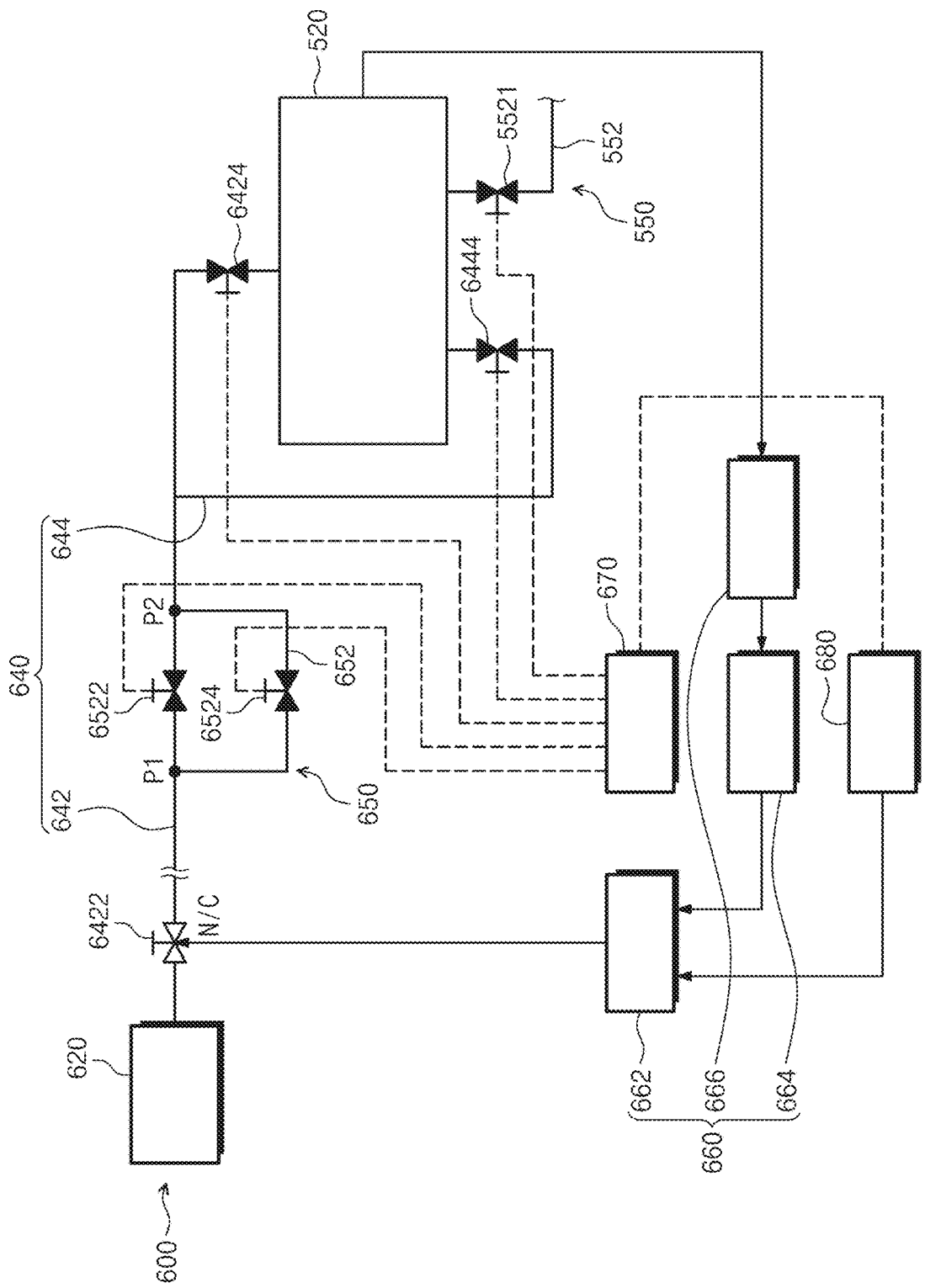
FIG. 5 illustrates a control flow when a safety valve of the drying treatment apparatus of FIG. 4 is opened.
Figure 6:
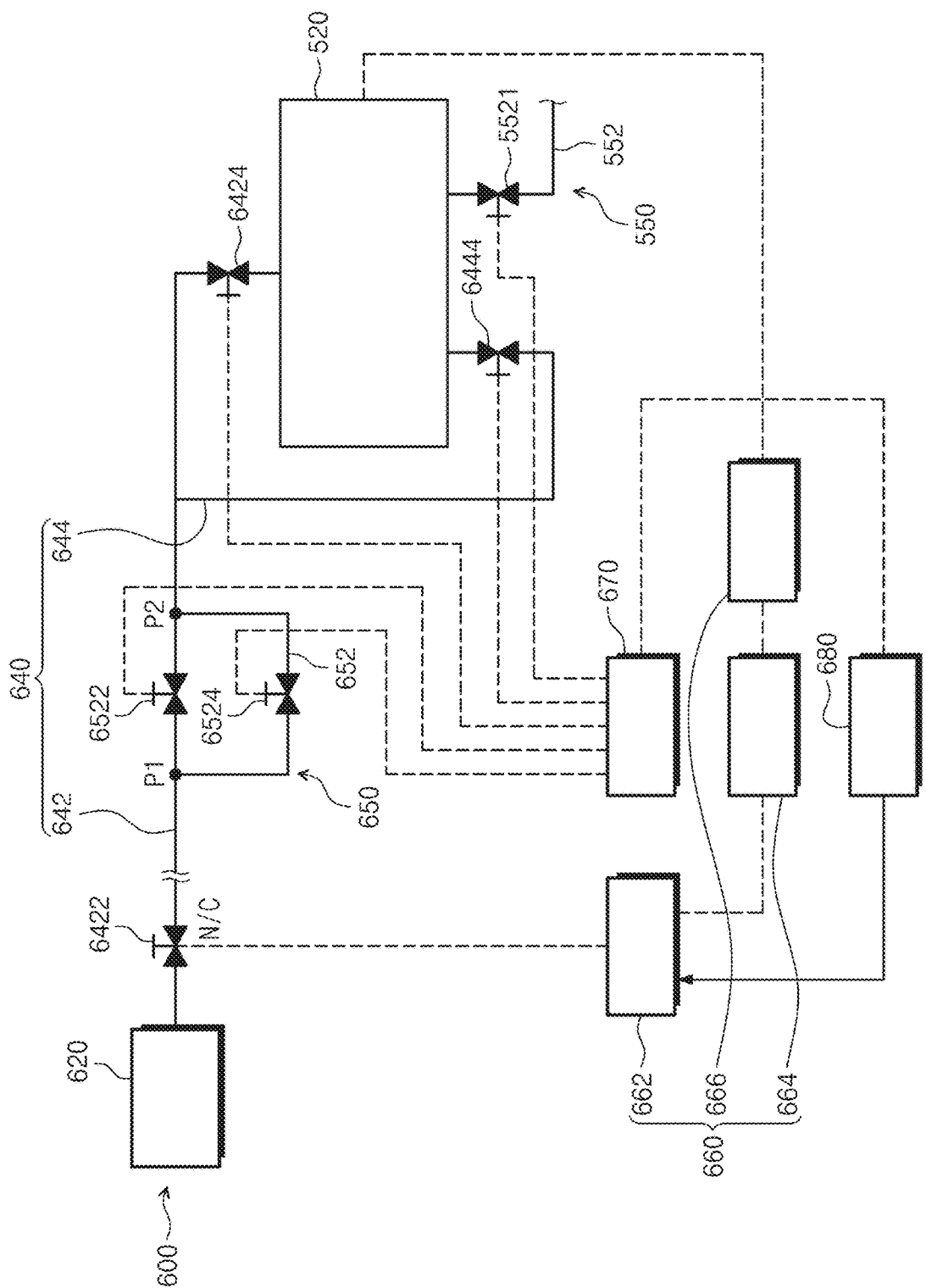
FIG. 6 illustrates a control flow when the safety valve of the drying treatment apparatus of FIG. 4 is not opened.

FIG. 5 illustrates a control flow when a safety valve of the drying treatment apparatus of FIG. 4 is an opened, and FIG. 6 illustrates a control flow when the safety valve of the drying treatment apparatus of FIG. 4 is not opened.

Referring to FIG. 5, a first controller 662 controls the safety valve 6422 to open a safety valve 6422 when an open signal of the safety valve 6422 is received from the integrated controller 680 and a power is supplied from the safety controller 666. However, referring to FIG. 6, when the first controller 662 receives the open signal of the safety valve 6422 from the integrated controller 680, but does not supply an air to the safety valve 6422 when the power is not supplied from the safety controller 666, the safety valve 6422 remains closed.

Conventionally, a method of controlling a high-pressure fluid by controlling a plurality of valves with one controller is used. However, in this method, a high-pressure treating fluid may be supplied even when a chamber is not closed, and thus a dangerous situation such as the chamber bursting may occur. In addition, in abnormal situations such as controller errors or a power supply disconnection, a dangerous situation may occur, such as an outflow of the high-pressure fluid from a tank and a supply of the high-pressure treating fluid to the chamber. In addition, a conventional method has a problem in that the power must always be supplied to the controller as a valve for supplying or blocking a fluid is controlled by one controller.

However, according to an embodiment of the inventive concept, the high-pressure treating fluid is installed on a supply line connecting the tank and the chamber, and a controller for controlling the valve installed at a closest position to the tank is configured to operate only when a safe situation is confirmed. Furthermore, a stability can be further improved by using a controller that controls a valve installed in the closest position to the tank as a control means for supplying the power from the safety controller. In addition, the valve installed in the closest position to the tank is configured as an N/C valve, so that the valve remains closed even when a power supply is cut off, so that a pressure of the tank does not leak, thereby improving the safety.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
a chamber providing a treating space; and
a fluid supply unit configured to supply a treating fluid to the chamber, and
wherein the fluid supply unit comprises:
a supply tank configured to store the treating fluid;
a supply line connecting the supply tank and the chamber; and
a plurality of valves installed at the supply line, and
wherein any one valve among the plurality of valves is provided as a safety valve, and
wherein the safety valve is configured to be opened after confirming that the chamber has been switched to a closed state when supplying the treating fluid from the supply tank to the chamber,
wherein the safety valve and a remaining valve except for the safety valve among the plurality of valves are configured to be controlled by different control modules,
wherein the safety valve is configured to be controlled by a first control module, and the remaining valve is configured to be controlled by a second control module, and
wherein the first control module includes
a first controller configured to control an open/close of the safety valve; and
a safety controller configured to control an operation of the first controller, and
wherein the safety controller is configured to control a power supplied to the first controller to control the first controller.

2. The substrate treating apparatus of claim 1, wherein the safety valve is provided closest to the supply tank among the plurality of valves.

3. The substrate treating apparatus of claim 1, wherein the first control module further comprises a relay configured to be operated by receiving a power supply signal of the safety controller and transmitting a power supplied by the safety controller to the first controller.

4. The substrate treating apparatus of claim 1, wherein the fluid supply unit further comprises an integrated controller configured to control the plurality of valves, and
wherein the first controller is configured to receive an open signal of the integrated controller and an open signal of the safety controller to control the safety valve to open the safety valve.

5. The substrate treating apparatus of claim 1, wherein the safety valve includes a solenoid valve.

6. The substrate treating apparatus of claim 1, wherein the safety valve includes a normal close valve (N/C valve).

7. The substrate treating apparatus of claim 1, wherein the supply tank is a high pressure tank, and the chamber is a high pressure chamber.

8. A substrate treating apparatus comprising:
a chamber providing a treating space;
a fluid supply unit configured to supply a treating fluid to the chamber, and
wherein the fluid supply unit comprises:
a supply tank configured to store the treating fluid;
a supply line connecting the supply tank and the chamber; and
a plurality of valves installed at the supply line, including a safety valve; and
a control module configured to control the plurality of valves, and
wherein the safety valve is provided closest to the supply tank among the plurality of valves, and is configured to be controlled by another control module,
wherein the safety valve is configured to be controlled to supply the treating fluid after confirming that the chamber has been switched to a closed state when supplying the treating fluid from the supply tank to the chamber,
wherein the safety valve is configured to be controlled by a first control module,
a remaining valve except for the safety valve among the plurality of valves is configured to be controlled by a second control module, and
wherein the first control module includes
a first controller configured to control an open/close of the safety valve;
a safety controller configured to control an operation of the first controller; and
a relay configured to be operated by receiving a signal of the safety controller and configured to transmit a power supplied by the safety controller to the first controller, and
wherein the safety controller is configured to control a power supplied to the first controller to control the first controller.

9. The substrate treating apparatus of claim 8, wherein the safety valve is a normally closed valve (N/C valve).

* * * * *